(12) United States Patent
Tsuchida et al.

(10) Patent No.: US 10,771,672 B2
(45) Date of Patent: Sep. 8, 2020

(54) DETACHABLE-HEAD-TYPE CAMERA AND WORK MACHINE

(71) Applicant: FUJI CORPORATION, Chiryu (JP)

(72) Inventors: Kosuke Tsuchida, Ooguchi-cho (JP); Nobuo Nagasaka, Okazaki (JP); Hidekazu Kanai, Chiryu (JP); Kenji Watanabe, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/317,109

(22) PCT Filed: Aug. 2, 2016

(86) PCT No.: PCT/JP2016/072689
§ 371 (c)(1),
(2) Date: Jan. 11, 2019

(87) PCT Pub. No.: WO2018/025333
PCT Pub. Date: Feb. 8, 2018

(65) Prior Publication Data
US 2019/0246017 A1   Aug. 8, 2019

(51) Int. Cl.
*H04N 5/232* (2006.01)
*H04N 5/225* (2006.01)
*H04N 7/01* (2006.01)

(52) U.S. Cl.
CPC ......... *H04N 5/23209* (2013.01); *H04N 5/225* (2013.01); *H04N 5/2254* (2013.01); *H04N 5/23203* (2013.01); *H04N 7/0135* (2013.01)

(58) Field of Classification Search
CPC .. H04N 5/225; H04N 5/2254; H04N 5/23203; H04N 5/23209; H04N 7/0135
See application file for complete search history.

(56) References Cited

U.S. PATENT DOCUMENTS 5,585,856 A * 12/1996 Nakaya ................. G09G 5/391
348/441
6,392,698 B1   5/2002 Yokoyama
(Continued)

FOREIGN PATENT DOCUMENTS

EP   1 389 771 A2   2/2004
EP   2 381 673 A1  10/2011
(Continued)

OTHER PUBLICATIONS

International Search Report dated Nov. 1, 2016 in PCT/JP2016/072689 filed Aug. 2, 2016.
(Continued)

*Primary Examiner* — Lin Ye
*Assistant Examiner* — Chriss S Yoder, III
(74) *Attorney, Agent, or Firm* — Oblon, McClelland, Maier & Neustadt, L.L.P.

(57) ABSTRACT

The present invention provides a detachable-head-type camera which, when a camera head unit is exchanged, can perform correction processing with a unique value corresponding to a camera head unit after the exchange, and provides a work machine including the detachable-head-type camera. Camera head unit of detachable-head-type camera is detachably connected to image data generation section via dedicated cable. In non-volatile memory of camera head unit, unique value corresponding to the characteristics unique to at least one of imaging element or lens is stored. Unique value is used for correction processing of image data performed by at least one of image data generation section or image processing unit.

5 Claims, 4 Drawing Sheets

(56) References Cited

U.S. PATENT DOCUMENTS

| | | | |
|---|---|---|---|
| 7,042,499 B1* | 5/2006 | Kido | H04N 1/00204 348/208.16 |
| 7,289,139 B2* | 10/2007 | Amling | A61B 1/00059 348/61 |
| 2002/0018126 A1 | 2/2002 | Ikeda et al. | |
| 2007/0296827 A1 | 12/2007 | Kubota et al. | |
| 2010/0229377 A1 | 9/2010 | Jindo et al. | |
| 2011/0001837 A1 | 1/2011 | Kotani | |
| 2016/0042122 A1* | 2/2016 | Sato | G06F 3/04815 715/781 |

FOREIGN PATENT DOCUMENTS

| | | |
|---|---|---|
| JP | 8-98087 A | 4/1996 |
| JP | 2000-125175 A | 4/2000 |
| JP | 2011-15299 A | 1/2011 |
| JP | 2013-26635 A | 2/2013 |
| JP | 5435804 B2 | 3/2014 |
| JP | 2016-38542 A | 3/2016 |

OTHER PUBLICATIONS

Ricoh Imaging Company, LTD., "GXR/Digital Camera|RICOH Imaging," Retrieved from the Internet [URL: http://www.ricoh-imaging.co.jp/japan/products/gxr/point.html], 2018, 3 Pages.

Sony Marketing (Japan) Inc., "RX-Series Special Site|Digital Still Camera Cyber-shot Cybershot|Sony," Retrieved from the Internet [URL:https://www.sony.jp/cyber-shot/rx/developer/rxl-d001/], 2015, 3 Pages.

Extended European Search Report dated Feb. 28, 2020, in Patent Application No. 16911594.6, 7 pages.

* cited by examiner

DETACHABLE-HEAD-TYPE CAMERA AND WORK MACHINE

TECHNICAL FIELD

The present application relates to a detachable-head-type camera in which an imaging element and a lens are unitized and detachable from a control unit, and a work machine for performing control based on image data captured by the detachable-head-type camera.

BACKGROUND ART

There are work machines, e.g., electronic component mounters, which include a camera for capturing an image of a circuit board on which electronic components are mounted (e.g., Patent Literature 1). The electronic component mounter described in Patent Literature 1 includes a control section for controlling the electronic component mounter, and a camera section having an imaging element and the like. The camera section is connected to the control section via a camera cable. The camera section includes a CPU, which is a processing circuit, a RAM, a flash memory, and the like, in addition to the imaging element. The CPU stores the operation history data of the camera section itself in the RAM, and upon receiving a storage request from the control section, writes the operation history data in the flash memory.

Non-Patent Literatures 1 and 2 each describe a camera for an individual user, the camera being composed of a control section and a camera section. The camera section is unitized by incorporating a processing circuit, which performs image processing and the like, in addition to a lens and an imaging element. The processing circuit performs processing for the lens and the imaging element which are unitized.

PATENT LITERATURE

Patent Literature 1: JP5435804B

NON-PATENT LITERATURE

Non-Patent Literature 1: Ricoh Imaging Co., Ltd., "GXR/Digital Camera|RICOHIMAGING", [online], [Searched on Jun. 10, 2016], Internet <URL: http://www.ricoh-imaging.co.jp/japan/products/gxr/point.html>
Non-Patent Literature 2: Sony Marketing Co., Ltd., "RX-Series Special Site|Digital Still Camera Cyber-shot Cybershot|Sony", [online], [Searched on Jun. 10, 2016], Internet <URL: https://www.sony.jp/cyber-shot/rx/developer/rx1-d001/>

BRIEF SUMMARY

Technical Problem

In the camera sections described above, for example, even if the camera section is of the same standard, an error occurs in the mounting position of the lens or the imaging element due to a limit of accuracy in the manufacturing process, and characteristics unique to the device, such as lens distortion, occur. For this reason, it is necessary for the processing circuit and the control section to perform lens distortion correction processing and the like using a unique value corresponding to the characteristics of the camera section.

Recently, among cameras used in industrial equipment such as FA (factory automation) equipment, there are so-called detachable-head-type cameras in which a camera head unit, including an imaging element and a lens, is detachable from a control section for controlling the camera head unit. In this detachable-head-type camera, the camera head unit is configured to be detachable with respect to the control unit, so that the camera head unit is exchangeable. In the detachable-head-type camera, unlike the above-described cameras, the camera head unit does not include an image processing section, and pixel data output from the imaging element of the camera head unit is output to the control unit. In such a detachable-head-type camera, when the camera head unit is exchanged, it is desired that the correction processing be appropriately performed with a unique value corresponding to the camera head unit after the exchange.

The present disclosure has been made in view of the above-mentioned problems, and an object of the present disclosure is to provide a detachable-head-type camera which, when a camera head unit is exchanged, can perform correction processing with a unique value corresponding to the camera head unit after the exchange, and to provide a work machine including the detachable-head-type camera.

Solution to Problem

The detachable-head-type camera disclosed in this specification includes: a camera head unit including an imaging element, a lens configured to cause light from outside to form an image on the imaging element, and a first storage device configured to store a unique value corresponding to characteristics of at least one of the imaging element or the lens; a connection member, being connected to the camera head unit, which is configured to transmit pixel data that is photoelectrically converted by the imaging element; and an image data generation section, being detachably connected to the camera head unit via the connection member, which is configured to acquire the unique value from the first storage device, configured to generate image data to be subjected to the image processing in an image processing unit from the pixel data input from the imaging element via the connection member, the image processing unit being connected to the image data generation section via a camera cable to perform image processing, and configured to output the image data to the image processing unit via the camera cable, wherein the unique value is used for correction processing on the image data performed in at least one of the image data generation section or the image processing unit.

Advantageous Effects

For example, when the camera head unit is exchanged, the image data generation section can acquire a unique value from the first storage device of a camera head unit after the exchange. Then, the image data generation section and the image processing unit can perform appropriate correction processing or the like according to the characteristics of the camera head unit after the exchange based on the acquired unique value.

DESCRIPTION OF EMBODIMENT

An embodiment will be described below with reference to the drawings. First, electronic component mounter (hereinafter, sometimes abbreviated as "mounter") 10 will be described as an example of a work machine including a detachable-head-type camera.

1. Configuration of Mounter 10

Figure 1:
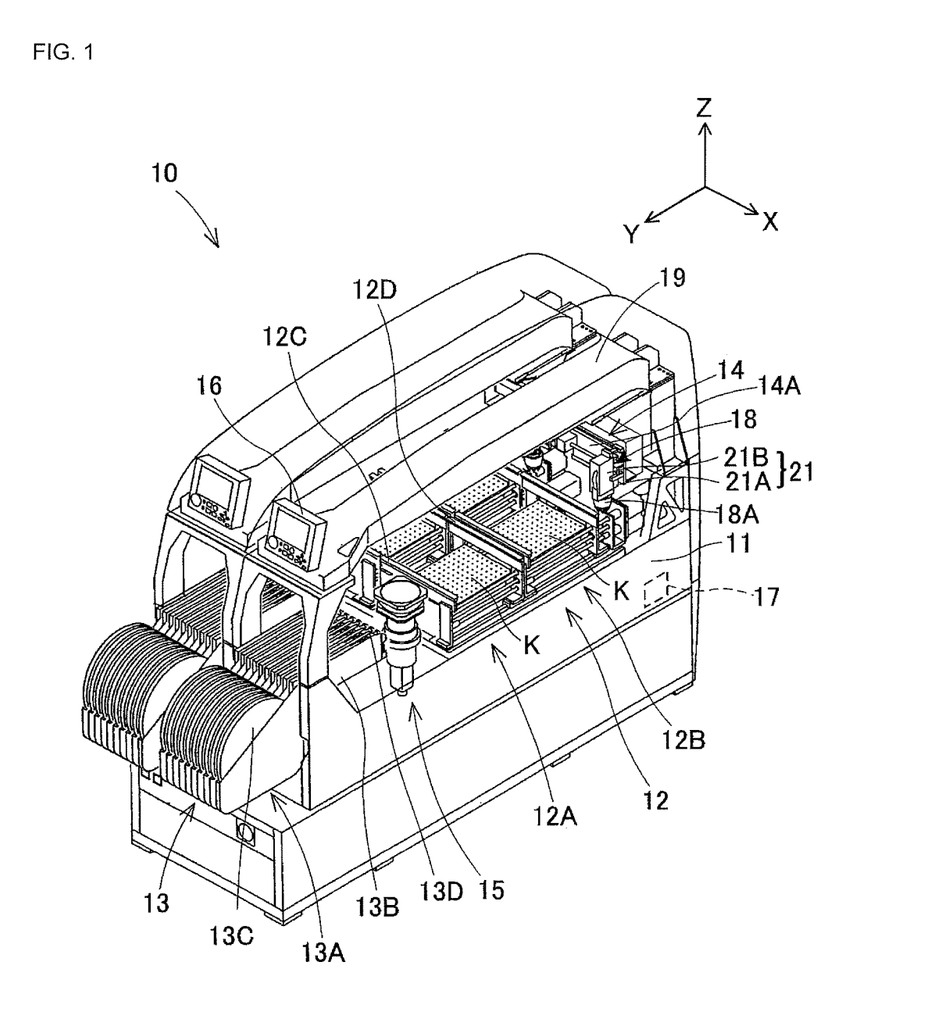
FIG. 1 is a perspective view of an electronic component mounter including a detachable-head-type camera according to an embodiment.

FIG. 1 is a perspective view showing the overall configuration of mounter 10. As shown in FIG. 1, mounter 10 is configured by arranging two sets of the same device adjacent to each other. Therefore, in the following description, only one set will be described. Mounter 10 is configured by assembling board conveyance device 12, component supply device 13, component transfer device 14, component camera 15, display device 16, main body 17, and the like to base 11. As shown in upper right XYZ coordinate axes of FIG. 1, the horizontal width direction (the direction from the upper left to the lower right in FIG. 1) of mounter 10 is referred to as the X-axis direction, the horizontal longitudinal direction (the direction from the upper right to the lower left in FIG. 1) of mounter 10 is referred to as the Y-axis direction, and a vertical height direction is referred to as the Z-axis direction.

Board conveyance device 12 is provided in the middle area in the longitudinal direction (Y-axis direction) of mounter 10. In board conveyance device 12, first conveyance device 12A and second conveyance device 12B are arranged in parallel, and two boards K are carried out in the X-axis direction by operating the devices in parallel. First conveyance device 12A includes, for example, a pair of guide rails 12C and 12D which are arranged on base 11 in parallel in the X-axis direction, and a pair of conveyor belts (not shown) which are guided by respective guide rails 12C and 12D and carry boards K while mounting the boards thereon. First conveyance device 12A is provided with a clamp device (not shown) that pushes up board K, which is conveyed to the component mounting position, from base 11 side and positions the board. Second conveyance device 12B is configured in the same manner as first conveying device 12A.

Component supply device 13 is a feeder type supply device, and is provided at the front portion in the longitudinal direction of mounter 10 (at the left front side in FIG. 1). Component supply device 13 is configured by arranging multiple cassette type feeders 13A in parallel on base 11. Each cassette type feeder 13A includes main body 13B detachably attached to base 11 and supply reel 13C loaded in the rear portion of main body 13B (the front side of mounter 10). Supply reel 13C is a medium for supplying electronic components and is wound with carrier tape (not shown) holding a predetermined number of components at regular intervals. Main body 13B draws out the leading end of the carrier tape to component supply section 13D provided at the distal end of main body 13B (the center side of mounter 10), with different electronic components being supplied from different carrier tapes.

Component transfer device 14 is a so-called XY robot type device that can move in the X-axis direction and the Y-axis direction, and is disposed from the rear portion in the longitudinal direction of mounter 10 (the right rear side in FIG. 1) to the upper portion of component supply device 13 at the front portion of the mounter. Component transfer device 14 is configured by XY-axis head drive mechanism 14A (most of which is hidden in FIG. 1), mounting head 18, and the like. XY-axis head drive mechanism 14A drives mounting head 18 in the X-axis direction and the Y-axis direction.

Mounting head 18 is driven by XY-axis head drive mechanism 14A, and has suction nozzle 18A for picking up a component by suction using negative pressure and mounting the component. Mounting head 18 is configured to raise and lower suction nozzle 18A in the Z-axis direction, and rotate the suction nozzle 18A about the Z-axis. Mounting head 18 has detachable-head-type camera 21 as an imaging device for capturing an image of positioned board K. Detachable-head-type camera 21 includes camera head unit 21A and camera control unit 21B.

Component camera 15 is an imaging device which is disposed on base 11 in the vicinity of component supply section 13D of component supply device 13, and captures an image of the component holding state of suction nozzle 18A of component transfer device 14. Display device 16 is disposed on the front upper portion of upper cover 19 and displays various types of information. Main body 17 is built into base 11 and is connected to above-described board conveyance device 12, component supply device 13, component transfer device 14, and component camera 15. Main body 17 exchanges information with board conveyance device 12 and the like as appropriate, and issues commands to control the individual devices in an integrated manner.

2. Configuration of Main Body 17 and Detachable-Head-Type Camera 21

Figure 2:
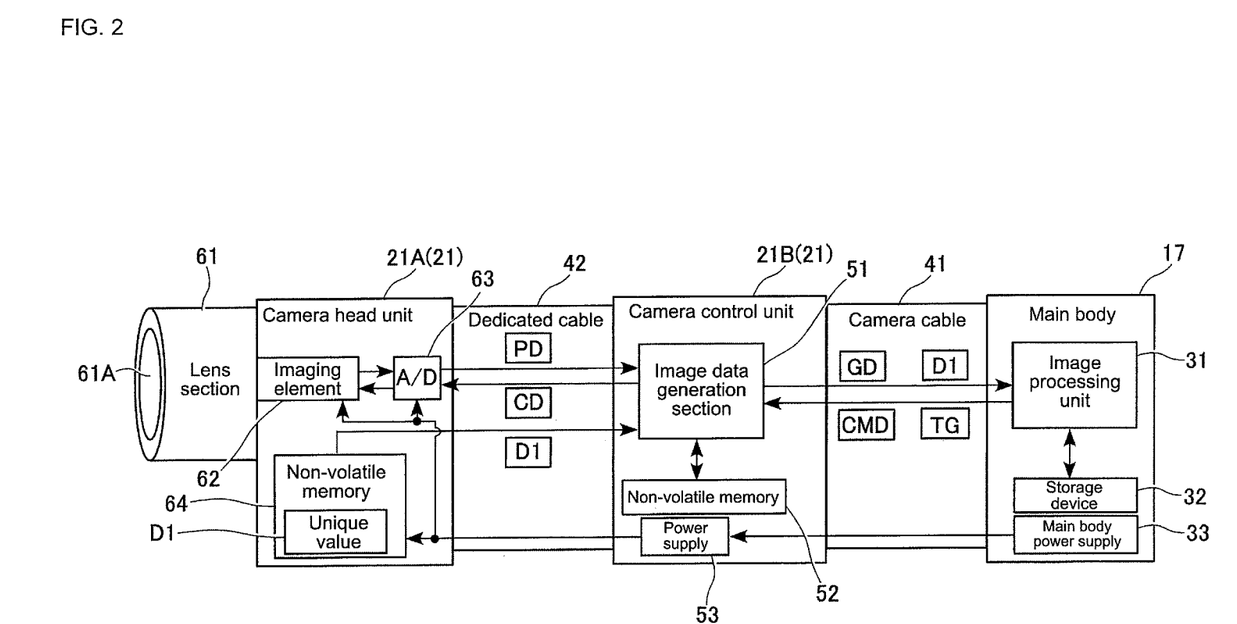
FIG. 2 is a block diagram showing a configuration of the detachable-head-type camera and a main body.

Next, the configurations of detachable-head-type camera 21 and main body 17 included in the above-described mounter 10 will be described in detail with reference to FIG. 2. As shown in FIG. 2, main body 17 includes image processing unit 31, storage device 32, and main body power supply 33. Image processing unit 31 performs image processing on image data GD captured by detachable-head-type camera 21. Image processing unit 31 stores temporary data during image processing and data after the image processing in storage device 32. Storage device 32 includes, for example, an optical drive device such as a hard disk device, RAM (Random Access Memory), and the like. Main body power supply 33 functions as a drive source for supplying power to detachable-head-type camera 21.

Camera control unit 21B of detachable-head-type camera 21 is detachably connected to main body 17 via camera cable 41. Camera control unit 21B performs transmission and reception of various types of signals to and from main body 17 and transmission of power to the main body via camera cable 41. Camera control unit 21B includes image data generation section 51, non-volatile memory 52, and power supply 53. Image data generation section 51 is configured by logical blocks of programmable logic devices, for example, an FPGA (Field Programmable Gate Array). Image data generation section 51 may be configured by, for example, dedicated hardware such as an ASIC.

Image processing unit 31 of main body 17 and image data generation section 51 of camera control unit 21B perform communication conforming to, for example, the Camera-Link standard through camera cable 41. Here, the Camera-Link standard is one of the communication standards defining a data transmission method for industrial digital cameras, and is a serial communication standard for transmitting data for image data GD or the like by LVDS (Low Voltage Differential Signaling: small-amplitude differential transmission method). The specifications of camera cable 41 conform to, for example, the base configuration CameraLink standard, and signal lines for transferring image data GD, command data CMD, and a control signal (such as trigger signal TG) are provided in camera cable 41. Camera cable 41 for transferring image data GD is not limited to the cable conforming to the CameraLink standard, and, for example, a cable of the USB3.0 standard, a LAN cable, or the like may be used. The communication method for transferring image data GD may be a communication method conforming to the GigEVision (registered trademark) standard or the CoaXPress (registered trademark) standard.

Image processing unit 31 performs low-speed serial communication (for example, communication conforming to the RS232C standard) through image data generation section 51 and camera cable 41. Image processing unit 31 outputs command data CMD to image data generation section 51 via serial communication. Image processing unit 31 reads unique value D1 stored in non-volatile memory 52, which will be described later, using command data CMD.

Non-volatile memory 52 is, for example, flash memory, and stores programs such as drivers for controlling imaging element 62 and lens section 61 by image data generation section 51, configuration data for constructing image data generation section 51, and the like. Power supply 53 supplies the power supplied from main body power supply 33 of main body 17 to non-volatile memory 52 and image data generation section 51.

Camera control unit 21B is connected to camera head unit 21A via dedicated cable 42. Dedicated cable 42 is, for example, a flexible printed board. Camera control unit 21B performs transmission and reception of various types of signals to and from camera head unit 21A and transmission of power with the camera head unit via dedicated cable 42. Power supply 53 of camera control unit 21B supplies power to camera head unit 21A via dedicated cable 42.

Camera head unit 21A includes lens section 61, imaging element 62, A/D converter 63, and non-volatile memory 64. Lens section 61 is configured by lens 61A, a lens holding member (not shown), and the like, and causes light from board K, which is a subject, to form an image on imaging element 62. Imaging element 62 is, for example, an image sensor such as a CCD or a CMOS. Imaging element 62 photoelectrically converts the light imaged on the imaging area by lens section 61, and outputs the conversion result as an analog imaging signal to A/D converter 63. A/D converter 63 converts the imaging signal input from imaging element 62 into pixel data PD of a digital signal, and outputs pixel data PD to image data generation section 51 via dedicated cable 42.

Image data generation section 51 outputs control signal CD to A/D converter 63 in response to input of trigger signal TG from image processing unit 31. As trigger signal TG, for example, CC1 among four types of camera control signals (CC1, CC2, CC3, and CC4) defined in CameraLink standard can be used. As control signal CD, a signal having the same content as trigger signal TG may be used, or a signal converted in accordance with the standard of camera head unit 21A or the like may be used.

A/D converter 63 outputs pixel data PD to image data generation section 51 in response to input of control signal CD from image data generation section 51. Image data generation section 51 generates image data GD from acquired pixel data PD according to the communication standard of camera cable 41 and the processing method of image processing unit 31. Image data generation unit 51 generates one frame of image data GD by adding header information to pixel data PD in accordance with, for example, the communication standard or the like. Image data generation section 51 outputs image data GD to image processing unit 31 via camera cable 41.

Note that image data generation section 51 may perform control other than the acquisition processing of pixel data PD, for example, initial setting of imaging element 62, using control signal CD. Image data generation section 51 may adjust the number of pixels of pixel data PD by changing the number of imaging elements 62, which output the pixel values, using control signal CD. Alternatively, image data generation section 51 may adjust the gain of imaging element 62 using control signal CD. Image data generation section 51 may acquire pixel data PD in advance before inputting trigger signal TG from image processing unit 31. For example, image data generation section 51 may acquire pixel data PD from A/D converter 63 in advance and store pixel data PD in non-volatile memory 52, and may generate image data GD from stored pixel data PD in response to the input of trigger signal TG and output image data GD to image processing unit 31.

3. Unique Value D1

Non-volatile memory 64 (first storage device) of camera head unit 21A is, for example, flash memory. In non-volatile memory 64, unique value D1 is stored as data to be referred to when correction processing of image data GD is performed by image data generation section 51 or image processing unit 31. Here, unique value D1 is, for example, data indicating characteristics unique to imaging element 62, such as defective pixel information or vertical stripe correction information. Alternatively, unique value D1 can be data indicating characteristics unique to lens section 61 such as lens distortion correction information or optical axis deviation information (including characteristics determined by the assembly error of lens 61A and imaging element 62).

The defective pixel information is coordinate information of a pixel (defective point) which becomes white (high brightness) or black (low brightness) regardless of the amount of light received by imaging element 62. In the present embodiment, for example, image data generation section 51 of camera control unit 21B corrects the defective point. Based on the coordinate information of the defective pixel information, image data generation section 51 determines the coordinates of the peripheral pixels to be used for correction of the pixel value of the defective point. Then, image data generation section 51 corrects the pixel value of the defective point using the pixel values of the peripheral pixels.

The vertical stripe correction information (line correction information) is offset information for variations in brightness of each vertical line of imaging elements 62 which are arranged in a matrix. In the present embodiment, for example, image processing unit 31 of main body 17 performs vertical stripe correction. Based on the vertical stripe correction information, image processing unit 31 corrects the pixel values of image data GD input from image data generation section 51 by the brightness set for each vertical line. Note that image processing unit 31 may correct variations in brightness for each horizontal line instead of or in addition to the vertical lines.

The lens distortion correction datum is information indicating the magnitude of the positional deviation of the light, incident on imaging element 62, caused by the distortion of lens 61A, and is information indicating the magnitude of the deviation between the image to be originally captured and the image actually captured. The lens distortion is caused by an error in the mounting position of lens 61A or imaging elements 62. In the present embodiment, for example, image processing unit 31 corrects the distortion (positional deviation) for each pixel by offsetting the pixel position for each pixel based on the lens distortion correction information.

The optical axis deviation correction information is information indicating the magnitude of the deviation between the center pixel of imaging elements 62 and the position of the center of an image. In other words, the optical axis deviation correction information is information indicating an amount by which an image appearing on imaging elements 62 deviates from the assumed position due to the relative positional relationship between lens 61A and imaging elements 62 and variations in the manufacturing accuracy of lens 61A. In the present embodiment, for example, image processing unit 31 corrects the positional deviation of an image by offsetting each position of the entire image of image data GD based on the optical axis deviation correction information.

Unique value D1 is not limited to the above-described defective pixel information or the like. For example, unique value D1 may be a look-up table. Here, the look-up table is a correspondence table for correcting a difference between a desired brightness and the brightness of an image (gamma correction). For example, image processing unit 31 may perform data conversion corresponding to the look-up table for each pixel of image data GD to correct the pixel value. Which of image data generation section 51 and image processing unit 31 performs each correction processing using unique value D1 described above can be changed as appropriate. For example, the sharing of processing may be determined according to the processing capabilities of image data generation section 51 and image processing unit 31, the number of pixels of imaging element 62, and the like.

4. Acquisition Processing of Unique Value D1 and Correction Processing

Next, an example of the operations of the acquisition processing of unique value D1 and the correction processing by image processing unit 31 and image data generation section 51 will be described with reference to the flowchart shown in FIG. 3. Image processing unit 31 and image data generation section 51 of the present embodiment perform the acquisition processing of unique value D1 when detachable-head-type camera 21 is powered and activated (for example, at the timing of activating mounter 10).

First, in step (hereinafter simply referred to as "S") 11 shown in FIG. 3, main body power supply 33 of main body 17 supplies power to power supply 53 of camera control unit 21B upon activation of mounter 10. When power is supplied to power supply 53, detachable-head-type camera 21 (image data generation section 51) starts activation processing. Power supply 53 supplies power to imaging elements 62, A/D converter 63, and non-volatile memory 64 of camera head unit 21A.

Next, image data generation section 51 acquires unique value D1 from non-volatile memory 64 of camera head unit 21A in accordance with the activation processing (S12). Image data generation section 51 stores acquired unique value D1 in non-volatile memory 52 of camera control unit 21B.

Next, image processing unit 31 and image data generation section 51 perform communication establishment processing via camera cable 41 (S13). Image processing unit 31 requests image data generation section 51 to establish communication using command data CMD defined by the CameraLink standard, and detects the establishment of communication by inputting responded command data CMD.

Next, when the communication establishment is detected, image processing unit 31 outputs command data CMD requesting necessary unique value D1 to image data generation section 51 (S14). In the present embodiment, as described above, image processing unit 31 performs the vertical stripe correction, the lens distortion correction, and the optical axis deviation correction. To this end, image processing unit 31 requests unique value D1, for vertical stripe correction and the like, from image data generation section 51. In response to the request from image processing unit 31, image data generation section 51 outputs unique value D1, corresponding to the request, to image processing unit 31. Image processing unit 31 stores unique value D1 input from image data generation section 51 in storage device 32. The timing at which image processing unit 31 and image data generation section 51 acquire unique value D1 is not limited to the timing at which detachable-head-type camera 21 is activated. For example, image processing unit 31 and image data generation section 51 may appropriately acquire necessary unique value D1 in accordance with the timing at which the correction processing is started. Image data generation section 51 may be set to output unique value D1 to image processing unit 31 each time acquiring unique value D1 from camera head unit 21A, regardless of the request from image processing unit 31.

Next, image processing unit 31 (main body 17) performs image capturing of board K by detachable-head-type camera 21 at each stage of the mounting operation by mounter 10 (see FIG. 1). At this time, image processing unit 31 outputs trigger signal TG to image data generation section 51 and instructs image-capturing (S15).

In response to trigger signal TG input from image processing unit 31, image data generation section 51 acquires pixel data PD from imaging element 62 (A/D converter 63) of camera head unit 21A and generates image data GD. Image data generation section 51 performs the correction processing on generated image data GD using unique value D1 (defective pixel information in present embodiment) stored in non-volatile memory 52 (S16). Image data generation section 51 outputs corrected image data GD to image processing unit 31 via camera cable 41.

Image processing unit 31 performs the correction processing on image data GD input from image data generation section 51 (S17). Image processing unit 31 performs the vertical stripe correction and the like, and stores corrected image data GD in storage device 32. In this manner, image processing unit 31 and image data generation section 51 perform the acquisition processing of unique value D1 and the correction processing of image data GD. Then, main body 17 performs detection of the edge of board K, detection of the error in the holding position of board K, detection of the mark described on board K, and the like using corrected image data GD, and adjusts the position and the like of mounting head 18 in accordance with the detection result, so that the mounting operation can be appropriately performed. The order of the processing shown in FIG. 3 is an example, and can be changed as appropriate. For example, image data generation section 51 may perform the establishment processing of the communication via camera cable 41 (S13) before the acquisition processing of unique value D1 (S12) or in parallel with the processing of S12.

5. Operation when Camera Head Unit 21A is Exchanged

When camera head unit 21A or camera control unit 21B is exchanged, image processing unit 31 and image data generation section 51 can appropriately acquire unique value D1 and perform appropriate correction processing by performing the processing described above.

Figure 4:
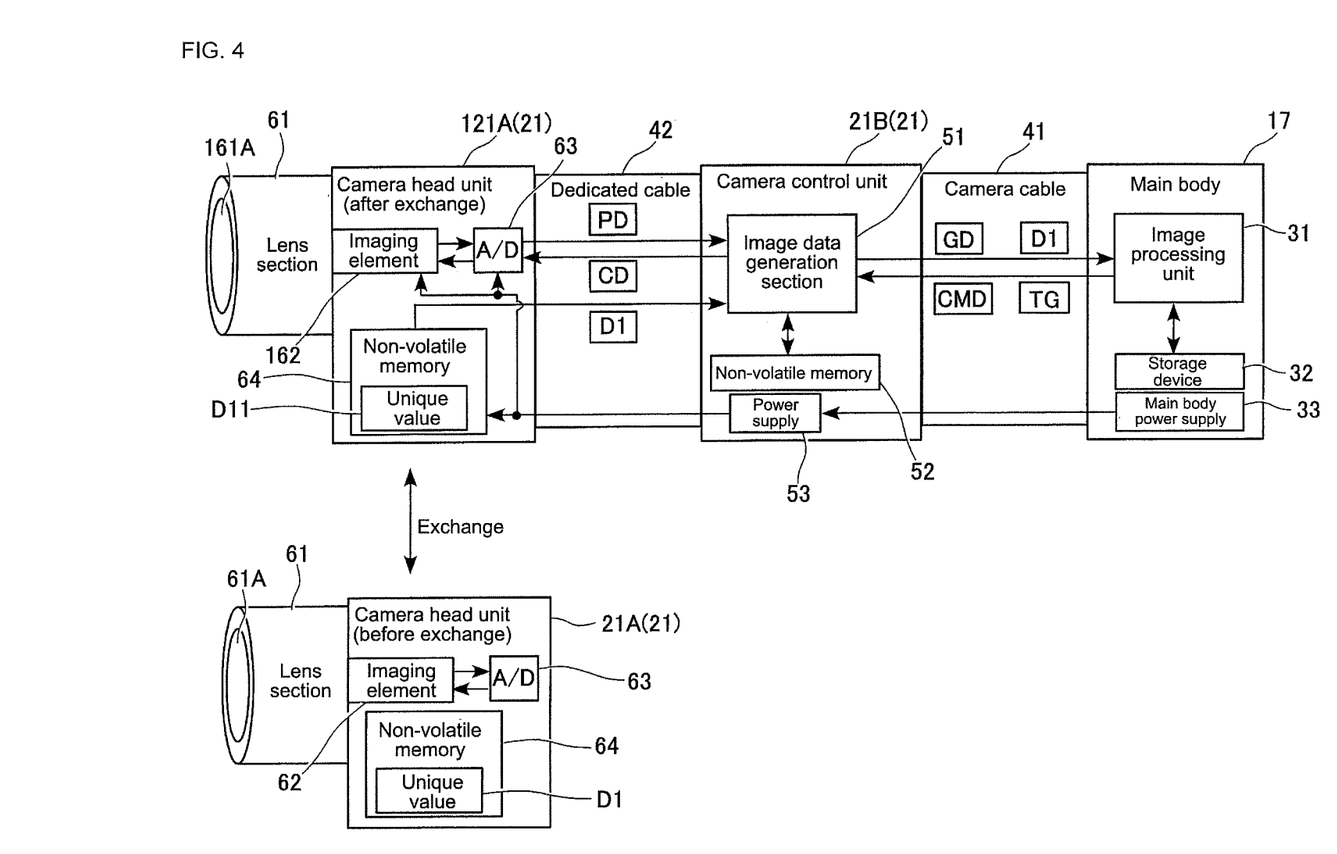
FIG. 4 is a block diagram for describing the unique value acquisition processing when a camera head unit is exchanged.

More specifically, FIG. 4 shows, as an example, a case where camera head unit 21A is exchanged. In order to distinguish camera head unit 21A, imaging element 62, lens 61A, and unique value D1 after exchange from those before the exchange, camera head unit 121A, imaging element 162, lens 161A, and unique value D11 are illustrated.

Here, camera head unit 21A and camera control unit 21B are exchanged when a failure occurs or when the unit is changed to a unit having different performance (such as the telephoto performance of lens 61A or the processing performance of image data generation section 51). In detachable-head-type camera 21 of the present embodiment, camera control unit 21B and camera head unit 21A are configured to be detachable from dedicated cable 42 and camera cable 41. Therefore, for example, when only camera head unit 21A fails, it is possible to exchange only the failed unit individually. As a result, it is possible to reduce the burden of the exchange operation by an operator and reduce the cost required for the operation.

In the case where camera head unit 21A is exchanged, even if camera head unit 21A before exchange and camera head unit 121A after the exchange are products of the same standard, unique value D11 after the exchange differs from unique value D1 before the exchange due to the difference in the characteristics unique to the device (for example, the difference in the position of a defective point) between lens 61A before the exchange and lens 161A after the exchange. Therefore, it is necessary for image data generation section 51 and the like to acquire unique value D11 corresponding to characteristics unique to lens 161A and imaging element 162 from camera head unit 121A after the exchange. In addition, even when camera control unit 21B is exchanged, camera control unit 21B after the exchange needs to acquire unique value D1 of camera head unit 21A connected thereto in order to perform appropriate correction processing.

On the other hand, image processing unit 31 and image data generation section 51 of the present embodiment perform processing for acquiring unique value D1 (unique value D11) at the time of activation as described above. Therefore, even when camera head unit 21A and camera control unit 21B are exchanged, image processing unit 31 and image data generation section 51 can perform the appropriate correction processing using unique value D11 corresponding to the characteristics of camera head unit 121A after the exchange by acquiring unique value D11 after the exchange at the time of activation.

6. Effects of Configuration of Embodiment

Detachable-head-type camera 21 of the above-described embodiment includes camera head unit 21A, dedicated cable 42 (connection member), and image data generation section 51. Camera head unit 21A includes imaging element 62, lens 61A for causing light from the outside to form an image on imaging element 62, and non-volatile memory 64 (first storage device) for storing unique value D1 corresponding to characteristics unique to at least one of imaging element 62 and lens 61A. Dedicated cable 42 is connected to camera head unit 21A and transmits pixel data PD photoelectrically converted by imaging element 62. Image data generation section 51 is detachably connected to camera head unit 21A via dedicated cable 42, acquires unique value D1 from non-volatile memory 64, is connected via camera cable 41 to image processing unit 31 for performing the image processing, generates image data GD that can be subjected to the image processing in image processing unit 31 from pixel data PD input from imaging element 62 via dedicated cable 42, and outputs image data GD to image processing unit 31 via camera cable 41. Unique value D1 is used for the correction processing on image data GD performed by at least one of image data generation section 51 or image processing unit 31.

According to this configuration, camera head unit 21A and image data generation section 51 are detachably connected via dedicated cable 42 (connection member). Camera head unit 21A includes, in addition to imaging element 62 and lens 61A, non-volatile memory 64 (first storage device) for storing unique value D1. Image data generation section 51 acquires unique value D1 from camera head unit 21A via dedicated cable 42 (S12 of FIG. 3). Image data generation section 51 generates image data GD from pixel data PD acquired from camera head unit 21A. Image processing unit 31 is connected to image data generation section 51 and performs the image processing on image data GD. At least one of image data generation section 51 or image processing unit 31 executes the correction processing on image data GD using unique value D1. As a result, when camera head unit 21A is exchanged, image data generation section 51 can acquire unique value D11 from non-volatile memory 64 of camera head unit 121A after the exchange (see FIG. 4). Then, image data generation section 51 and image processing unit 31 can perform the correction processing appropriately according to the characteristics of camera head unit 121A after the exchange based on acquired unique value D11.

Further, image data generation section 51 further includes non-volatile memory 52 (second storage device), acquires unique value D1 from non-volatile memory 64 (first storage device) when camera head unit 21A is activated, and stores acquired unique value D1 in non-volatile memory 52.

According to this configuration, when camera head unit 21A is activated, image data generation section 51 acquires unique value D1 from non-volatile memory 64 of camera head unit 21A and stores the unique value in non-volatile memory 52. As a result, image data generation section 51 can acquire unique value D11 of camera head unit 121A after the exchange in accordance with the exchange of camera head unit 21A (see FIG. 4).

Figure 3:
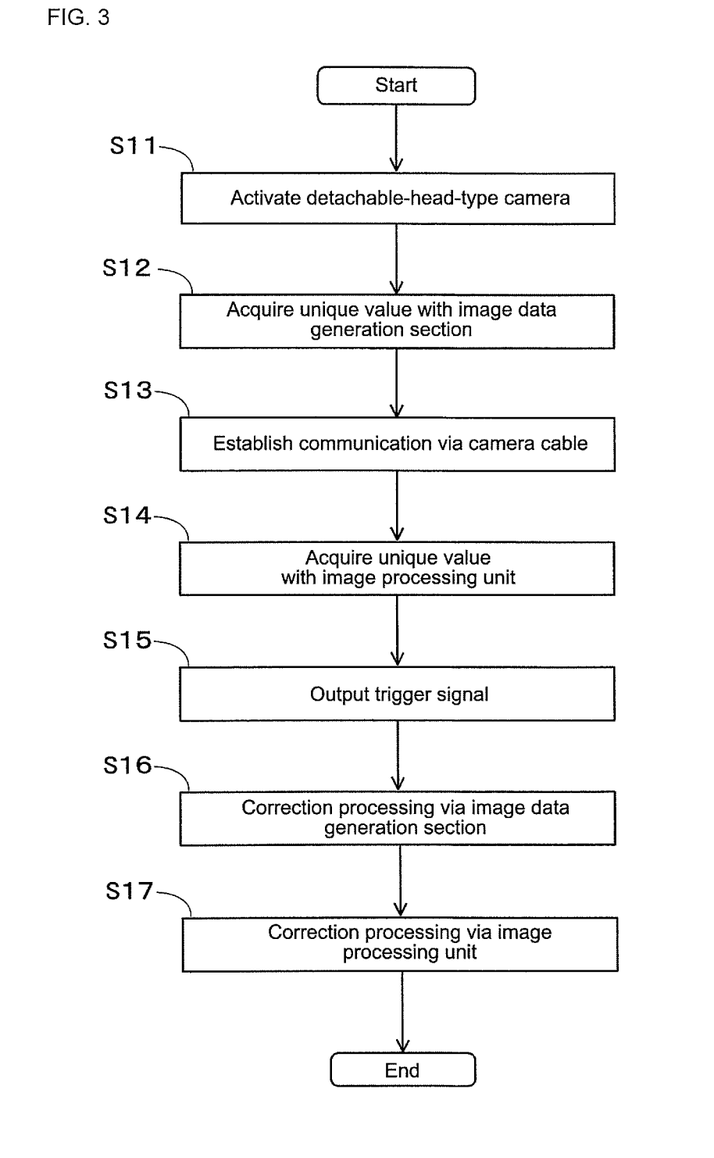
FIG. 3 is a flowchart for describing the flow of unique value acquisition processing and correction processing using the unique value by an image processing unit and an image data generation section.

Further, in response to the request from image processing unit 31, image data generation section 51 outputs unique value D1 corresponding to the request to image processing unit 31 via camera cable 41 (S14 of FIG. 3).

Consequently, image processing unit 31 can appropriately acquire unique value D1, required in the correction processing for image data GD, from image data generation section 51.

Further, non-volatile memory 64 (first storage device) stores information of at least one of the defective pixel information or the line correction information as unique value D1 of imaging element 62.

According to this configuration, image data generation section 51 and image processing unit 31 can perform correction of the defective point by the peripheral pixels, based on the defective pixel information. In addition, image data generation section 51 and the like can correct variations in brightness of the vertical lines and horizontal lines of imaging element 62 based on the line correction information.

Further, non-volatile memory 64 (first storage device) stores information of at least one of the lens distortion correction information or the optical axis deviation information as unique value D1 of lens 61A.

According to this configuration, image data generation section 51 and image processing unit 31 can correct the positional deviation of light incident on imaging element 62, caused by the lens distortion, based on the lens distortion correction information. Further, image data generation section 51 and the like can correct the positional deviation of the entire image, caused by the relative position of lens 61A with respect to imaging element 62, based on the optical axis deviation information.

7. Modification to Embodiment

In the above embodiment, a camera for capturing an image of board K is employed as the detachable-head-type camera, but the configuration is not limited to this. For example, component camera 15 for capturing an image of the component suction state of suction nozzle 18A may be configured by a detachable-head-type camera. In the above embodiment, camera head unit 21A and camera control unit 21B are configured to be detachable from dedicated cable 42, but the configuration is not limited to this. For example, camera head unit 21A may be configured to be detachable from camera control unit 21B by connecting or disconnecting a cable fixed to camera head unit 21A to or from a cable fixed to camera control unit 21B.

In the above embodiment, non-volatile memory 64 stores both unique value D1 (lens distortion correction information, etc.) corresponding to the characteristics of lens 61A and unique value D1 (defective pixel information, etc.) corresponding to the characteristics of imaging element 62, but may be configured to store only one of these unique values. Camera head unit 21A and camera control unit 21B transmit pixel data PD and unique value D1 via one dedicated cable 42, but the respective data may be transmitted via different communication cables.

Further, electronic component mounter 10 for mounting electronic components on board K is employed as the work machine in the above embodiment, but the configuration is not limited to this, and work machines for various other uses can be employed. For example, the work machine may be a work machine (robot for work) that performs an assembling operation of a secondary battery (such as a solar cell or a fuel cell), or may be a screen printing device that moves a squeegee along a mask and prints printing agent on a printing target member. The work machine is not limited to a machine for mounting boards or assembling components, and may be a machine tool for performing, for example, a cutting operation.

REFERENCE SIGNS LIST

10: electronic component mounter (work machine), 21: detachable-head-type camera, 21A, 121A: camera head unit, 31: image processing unit, 42: dedicated cable (connecting member), 51: image data generation section, 52: non-volatile memory (second storage device), 61A, 161A: lens, 62, 162: imaging element, 64: non-volatile memory (first storage device), D1, D11: unique value, PD: pixel data, GD: image data.

The invention claimed is:

1. A detachable-head-type camera, comprising:
   a camera head unit including an imaging element, a lens configured to cause light from outside to form an image on the imaging element, and a first storage device configured to store a unique value corresponding to characteristics of at least one of the imaging element or the lens;
   a connection member, being connected to the camera head unit, which is configured to transmit pixel data that is photoelectrically converted by the imaging element; and
   an image data generation section, being detachably connected to the camera head unit via the connection member, which is configured to acquire the unique value from the first storage device, configured to generate image data to be subjected to the image processing in an image processing unit from the pixel data input from the imaging element via the connection member, the image processing unit being connected to the image data generation section via a camera cable to perform image processing, and configured to output the image data to the image processing unit via the camera cable, wherein
   the unique value is used for correction processing on the image data performed in at least one of the image data generation section or the image processing unit, and
   in response to a request from the image processing unit, the image data generation section is configured to output the unique value corresponding to the request to the image processing unit via the camera cable.

2. The detachable-head-type camera according to claim 1, wherein
   the image data generation section further includes a second storage device, and the detachable-head-type camera is configured to acquire the unique value from the first storage device when the camera head unit is activated and store the acquired unique value in the second storage device.

3. The detachable-head-type camera according to claim 1, wherein
   the first storage device is configured to store at least one of defective pixel information or line correction information as the unique value of the imaging element.

4. The detachable-head-type camera according to claim 1, wherein
   the first storage device is configured to store at least one of lens distortion correction information or optical axis deviation information as the unique value of the lens.

5. A work machine, comprising
   the detachable-head-type camera according to claim 1, wherein the work machine is configured to perform control based on the image data output from the detachable-head-type camera.

* * * * *